US005631066A

United States Patent [19]

O'Brien

[11] Patent Number: 5,631,066
[45] Date of Patent: May 20, 1997

[54] PROCESS FOR MAKING METALIZED FILMS AND FILMS PRODUCED THEREFROM

[75] Inventor: William G. O'Brien, Newark, Del.

[73] Assignee: Chronopol, Inc., Golden, Colo.

[21] Appl. No.: 427,635

[22] Filed: Apr. 21, 1995

Related U.S. Application Data

[63] Continuation of Ser. No. 171,080, Dec. 21, 1993, abandoned, which is a continuation-in-part of Ser. No. 8,889, Jan. 25, 1993, abandoned.

[51] Int. Cl.$^6$ .............................. B32B 3/00; B32B 27/14; B32B 15/08; B32B 29/00
[52] U.S. Cl. .............................. 428/195; 283/56; 428/336; 428/458; 428/460; 428/464; 428/496; 428/530; 428/537.5
[58] Field of Search ............................... 428/458, 457, 428/460, 464, 537.5, 336, 496, 526, 530, 195; 283/74, 56

[56] References Cited

U.S. PATENT DOCUMENTS

| 2,890,208 | 6/1959 | Young | 528/357 |
|---|---|---|---|
| 3,645,942 | 2/1972 | Blood | 523/142 |
| 3,839,297 | 10/1974 | Versfelt | 528/357 |
| 4,254,173 | 3/1981 | Peer | 428/204 |
| 4,797,468 | 1/1989 | DeVries | 528/354 |
| 4,800,219 | 1/1989 | Murdoch | 525/413 |
| 5,028,667 | 7/1991 | McLain | 525/415 |
| 5,076,983 | 12/1991 | Loomis | 264/101 |
| 5,142,023 | 8/1992 | Gruber | 528/354 |
| 5,180,765 | 1/1993 | Sinclair | 524/306 |
| 5,202,413 | 4/1993 | Spinu | 528/354 |
| 5,208,297 | 5/1993 | Ford | 525/415 |
| 5,270,400 | 12/1993 | Spinu | 525/411 |

FOREIGN PATENT DOCUMENTS

| 0514137 | 11/1992 | European Pat. Off. . |
|---|---|---|
| 1397570 | 6/1975 | United Kingdom . |

OTHER PUBLICATIONS

Stecher et al, Editor, The Merck Index, Eighth Edition, p. 604, 1968.
H.R. Kricheldorf & A. Sieria, Polymer Bullentin, 14, 497–502, 1985.
J.W. Leinslag & A.J. Pennings, Makromal Chem. 188, 1809–1814, 1987.
Paperboard Packaging, Jul., 1989 pp. 30 and 32.
Paperboard Packaging, Mar. 1992, pp. 34 & 36.
Paperboard Packaging, Apr., 1989, pp. 48, 50 & 52.

*Primary Examiner*—Paul J. Thibodeau
*Assistant Examiner*—Stephen Sand
*Attorney, Agent, or Firm*—Sheridan Ross P.C.

[57] ABSTRACT

A process for producing metalized packaging films comprises the step of sputtering a metal, such as aluminum, gold, silver, copper, platinum, nickel, titanium or tantalum onto a biodegradable poly(hydroxy acid), preferably poly(lactic acid) film, which may then be adhered to a cellulosic substrate if desired.

12 Claims, No Drawings

PROCESS FOR MAKING METALIZED FILMS AND FILMS PRODUCED THEREFROM

CROSS REFERENCE TO RELATED APPLICATIONS

This application is a continuation of Ser. No. 08/171,080, filed Dec. 21, 1993 and now abandoned, which is a continuation-in-part of Ser. No. 08/008,889, filed Jan. 25, 1993 and now abandoned.

FIELD OF THE INVENTION

This invention relates to metalized members formed of biodegradable poly(hydroxy acid)s. In particular, the invention relates to poly(hydroxy acid), especially poly(lactic acid) members, such as films, optical tools, etc., that have been metalized by sputtering with a metal such as aluminum.

BACKGROUND OF THE INVENTION

Polymers and copolymers of hydroxy acids, generally known as poly(hydroxy acid)s, slowly hydrolyze and biodegrade to environmentally benign products. These polymers are well behaved thermoplastics with appealing aesthetic qualities. Consequently, high molecular weight polymers (that is, those having a molecular weight of at least 10,000 and typically in the range of 15,000 to 500,000) of hydroxy acids, especially lactic acid and glycolic acid, are potential replacements for poly(styrene) and other non-biodegradable polymers in numerous applications, such as packaging. However, a major disadvantage of such polymers as a food packaging materials is that they have relatively high moisture permeability, which would decrease the self-life of foods packaged in such material. This invention is based on the discovery that adding a metalized layer to films of these poly(hydroxy acid)s dramatically improves their impermeability to moisture, without adversely interfering with their environmentally benign character. In addition, these metalized poly(hydroxy acid) films can be quite decorative, thus making such materials the ones of choice for use in packaging.

SUMMARY OF THE INVENTION

In one embodiment, the invention comprises a metalized film comprising:

(1) a biodegradable film having a thickness of 25 to 125 microns, said film comprising a poly(hydroxy acid);

(2) a metal coating on said film, said coating having a thickness of 20 to 50 nanometers; said metal selected from the group consisting of aluminum, gold, silver, platinum, copper, nickel, titanium and tantalum.

In another embodiment, the invention is a process for producing a metalized film comprising the step of sputtering a metal selected from the group consisting of aluminum, gold, silver, platinum, copper, nickel, titanium and tantalum to a thickness of 20 to 50 nanometers onto a biodegradable film having a thickness of 25 to 125 microns, wherein said film comprises a poly(hydroxy acid).

In another embodiment, the invention is a laminate comprising, in order:

(1) a cellulosic substrate;

(2) an adhesive;

(3) a biodegradable film having a thickness of 25 to 125 microns, said film comprising a poly(hydroxy acid) and having a metal coating with a thickness of 20 to 50 nanometers; said metal selected from the group consisting of aluminum, gold, silver, platinum, copper, nickel, titanium and tantalum; wherein said metal coating is positioned adjacent said adhesive.

DETAILED DESCRIPTION OF THE INVENTION

The present invention relates to metalized poly(lactic acid) articles, particularly films. The articles generally have a metal coating from 20 to 50 nanometers. The preferred metal is aluminum, but other metals such as gold, silver, platinum, copper, nickel, titanium and tantalum are also contemplated.

The metalized films disclosed herein have been found to biodegrade significantly more rapidly than other metalized films. While not bound by any particular theory, it is believed that the degradation of the poly(hydroxy acid)s generates the acid precursor(s) which then catalyze or accelerate the decomposition of the metal layer.

Poly(hydroxy acid)

The poly(hydroxy acid) is formed from a biodegradable poly(lactic acid) or copolymer containing lactic acid monomers. Poly(lactic acid) is typically prepared by the catalyzed ring opening polymerization of lactide (1,4-dioxane-3,6-dimethyl-2,5-dione), the dimeric cyclic ester of lactic acid. Because of its manner of preparation, poly(lactic acid) is frequently referred to as polylactide. Copolymers of lactic acid are typically prepared by catalyzed copolymerization of lactide with one or more cyclic esters (lactones) and/or dimeric cyclic esters.

Typical co-monomers are: glycolide (1,4-dioxane-2,5-dione), the dimeric cyclic ester of glycolic acid; beta-propiolactone, the cyclic ester of 3-hydroxypropanic acid; alpha,alpha-dimethyl-beta-propiolactone, the cyclic ester of 2,2-dimethyl-3-hydroxypropanic acid; beta-butyrolactone, the cyclic ester of 3-hydroxybutyric acid; delta-valerolactone, the cyclic ester of 5-hydroxypentanoic acid; epsilon-caprolactone, the cyclic ester of 6-hydroxyhexanoic acid, and the lactones of its methyl substituted derivatives, such as 2-methyl-6-hydroxyhexanoic acid, 3-methyl-6-hydroxyhexanoic, 4-methyl-6-hydroxyhexanoic acid, 3,3,5-trimethyl-6-hydroxyhexanoic acid, etc., the cyclic ester of 12-hydroxydodecanoic acid; and 2-p-dioxanone, the cyclic ester of 2-(2-hydroxyethyl)-glycolic acid.

Poly(lactic acid) and the lactic acid copolymers contemplated for use herein typically have glass transition temperatures ("Tg") of about 50° C. in contrast to the Tg of about 170° C. for polycarbonates and 200° C. for polyesters. Further, the degradation temperature of polycarbonate typically occurs at about 360° C. while degradation of lactic acid polymers typically occurs at about 180° C.

The preferred poly(hydroxy acid)s are poly(lactic acid), poly(glycolic acid), and copolymers of lactic acid and/or glycolic acid that may contain up to 30% by weight of an additional hydroxy acid monomer. The most preferred poly (hydroxy acid) is poly (lactic acid). Preparation of poly (hydroxy acid)s has been described in numerous references well known to those skilled in the art, for example: Young, U.S. Pat. Nos. 2,890.208; Blood, 3,645,942; Versfelt, 3,839, 297; De Vries 4,797,468; H. R. Kricheldorf and A. Serra, *Polymer Bulletin*, 14, 497–502, 1985; J. W. Leenslag and A. J. Pennings, *Makromol. Chem.* 188, 1809–1814, 1987; Murdoch, 4,800,219; McLain, 5,028,667; Gruber, 5,142, 023; Sinclair, 5,180,765; Ford, 5,208,297 and PCT Application PCT/US92/11309.

Sputtering

Metal films have been sputtered on various plastic substrates in the past. The various sputtering techniques used include magnetron sputtering, reactive sputtering, diode sputtering and triode sputtering. Various metals including aluminum, gold and platinum have been sputter coated in the past. The plastics which previously have been coated with metals by sputtering generally were those having a Tg above 150° C., such as polyesters and polycarbonates.

The sputtering of the metal film according to the present invention may be carried out using a conventional apparatus. Generally, coating the metal on the film is accomplished by scanning the substrate being coated (which substrate is loaded on a pallet) past a sputtering source such as, for example, a rectangular magnetton sputtering source. The type of apparatus used for sputtering the metal layer depends in large part upon the intended use of the film which, in turn, will dictate the necessary quality of the metalized layer. For example, in packaging applications where the quality of the metalized coating is generally less important, it may be desirable to utilize a process whereby the metalized layer is applied to a continuous web of film as is known in the art. On the other hand, for applications where a very high quality coating is desired, such as in the production of audio or audio/visual compact disks, a more demanding (and expensive) coating method may be indicated.

A particularly suitable sputtering source is a focused cathode source, wherein a plurality of target bars are held in such a manner that all of the target bars are inwardly inclined. This inward inclination, together with appropriate placement of election capture shields, permits a small target to pallet separation. The result is a coating configuration in which sputtered material is very efficiently transferred from target to substrate.

The poly(hydroxy acid) film may be printed with a message or advertising indicia, for example, before metalization if desired for the particular end use application.

Laminated Structures

The metalized film of the present invention may be adhered to a suitable cellulosic, preferably paperboard or cardboard, to comprise laminated structures. In such structures, the substrate is adhered to the metalized side of the poly(hydroxy acid) film.

The cellulosic substrate and metalized film are laminated together using a thin layer of adhesive. In character with the environmental advantages of the invention, it is preferable for a biodegradable adhesive to be employed. In addition, if the film has been printed before metalization, a transparent adhesive should be used. A preferred adhesive is a layer of a poly(hydroxy acid) applied, e.g., by spraying or calendering, onto the cellulosic substrate or metalized film just prior to lamination.

Industrial Applicability

The metalized poly(hydroxy acid)s provide a biodegradable packaging material that is impervious to moisture. The film may be printed to make an attractive packaging film.

The advantageous properties of this invention can be observed by reference to the following examples which illustrate, but do not limit, the invention.

EXAMPLES

EXAMPLE 1

Poly(lactic acid) samples in the form of injection molded disks (86 mm diameter, 1.2 mm thick) and films (37 µm and 125 µm) were stored overnight in a 0% relative humidity room temperature environment. The next day, the samples were transferred to a Leybolt-Heraus multilayer vacuum sputtering system Model Z600 (comprising a palletized conveying system which horizontally transports samples beneath a series of DC Magnitron sputtering sources). The system was pumped down to $1 \times 10^{-4}$ torr and the palletized poly(lactic acid) samples were conveyed beneath the Magnitron energized aluminum target at a rate of 0.7 ft/min which gave a predetermined aluminum thickness of 50 to 70 nanometers.

The coating quality and behavior of the poly(lactic acid) samples in the sputtering system were equivalent to aluminum coated polyethylene, polypropylene, polyethylene terephthalate or polycarbonate plastics typically used for barrier, decorative, or more sophisticated opto-electronic end use. The poly(hydroxy acid)/aluminum adhesion was judged equivalent to above aluminum/plastic combinations. The successful performance of poly(hydroxy acid) in this sophisticated vacuum coating operation illustrates the feasibility of poly(hydroxy acid)/aluminum coating on the larger scale high productivity, lower quality equipment used to mass-produce plastic/aluminum coatings for barrier and decorative packaging markets.

EXAMPLE 2

To illustrate the aging characteristics of the films of the invention, aluminum coated poly(lactic acid) film samples (thickness =39 µm and 125 µm) were stored at 30%, 57%, 75%, and 100% relative humidity at temperatures of 22° C., 35° C. and 4° C. Aluminum coated samples of poly(ethylene terephthalate) (thickness=50 µm) were employed as controls. After 2 to 3 days, the aluminum coatings on the sample stored at 40° C. at 100% relative humidity were completely gone while the coating on the poly(ethylene terephthalate) sample stored under the same conditions was mirror bright and essentially unaffected. The condition of the samples after 30 days storage is shown in Table 1.

TABLE 1

| Temp. (°C.) | Relative Humidity (%) | Poly(lactic acid) | | PET[1] |
|---|---|---|---|---|
| | | (39 nm) | (125 nm) | (50 nm) |
| 22 | 30 | no effect | no effect | no effect |
| 22 | 57 | no effect | no effect | no effect |
| 22 | 75 | clear spots | clear spots | no effect |
| 22 | 100 | 100% gone | 100% gone | surface haze |
| 35 | 30 | no effect | no effect | no effect |
| 35 | 57 | no effect | no effect | no effect |
| 35 | 75 | clear spots | 100% gone | no effect |
| 35 | 100 | 100% gone | 100% gone | haze, edge attack |
| 40 | 30 | clear spots | clear spots | no effect |
| 40 | 57 | clear spots | clear spots | no effect |
| 40 | 75 | 50% gone | 100% gone | haze, edge attack |
| 40 | 100 | 100% gone | 100% gone | 100% gone |

[1]PET = poly(ethylene terephthalate)

EXAMPLE 3

A plurality of disks of poly(lactic acid) were molded having a 15 mm inside diameter, an 86 mm outside diameter and a thickness of 1.20 mm using known techniques with a nominal 16 second cycle time. Particular attention was paid to the temperature (e.g. maximum barrel/nozzle temperature of 170° C. and molding temperature of 35° C.) due to the low Tg of the poly(lactic acid) versus polycarbonate resins. The disks were provided with a grooved surface having a 1.6 µm pitch and a nominal 0.4 µm width and 0.07 µm depth. A plurality of the disks prepared above were sputtered with aluminum to a depth of 50 nanometers using conventional techniques.

The disks were then subjected to an aging study at various temperature and humidity levels, similar to Example 2. After 6 days at 25° C. and 100% relative humidity, the disks of the invention showed pinholes in the aluminum layer on the order of 1–2 μm in size. Control disks made from polycarbonate were unchanged after 4000 hours at 75° C. and 80% relative humidity.

EXAMPLE 4

Laminates having the components listed below are prepared by printing the poly(hydroxy acid) film with suitable indicia in red, white and black and then a layer of aluminum is applied to the printed side by conventional vacuum deposition (sputtering) in the manner described in Peer, U.S. Pat. No. 4,254,173 at Col. 3, lines 32–59. The cellulosic substrate is spray coated with a uniform, thin layer of molten 95,000 MW polylactide and the film calendered thereto.

Sample 1
Film: polyglycolide 100,000 MW, 3 mils thick
Metal: aluminum, 25 nm thick
Cellulosic Substrate 25 mil poster board
Sample 2
Film: poly(lactide/epsilon-caprolactone) 85/15, 10% plasticizer
70,000 MW, 1 mil thick
Metal: aluminum, 50 nm thick
Cellulosic Substrate: 25 mil poster board

What is claimed:

1. A metalized packaging film comprising (a) a biodegradable poly(hydroxy acid) film having a thickness of 25–125 micrometers having adhered to one side thereof (b) a metal coating having a thickness of 20–50 nanometers, wherein the coating metal is selected from the group consisting of Al, Au, Ag, Pt, Cu, Ni, Ti and Ta.

2. The metalized packaging film of claim 1 in which the coating metal is aluminum.

3. The metalized packaging film of claim 1 in which the poly(hydroxy acid) is selected from the group consisting of homopolymers of lactic acid homopolymers of glycolic acid, copolymers of lactic acid with up to 30% by weight of another hydroxy acid, copolymers of glycolic acid with up to 30% by weight of another hydroxy acid and mixtures thereof.

4. The metalized packaging film of claim 3 in which the poly(hydroxy acid) is poly(lactic acid).

5. The metalized packaging film of claim 1 in which the metal-coated side of the biodegradable film is laminated to a cellulosic substrate by means of an intervening adhesive layer.

6. The metalized packaging film of claim 5 in which the adhesive layer is biodegradable.

7. The metalized packaging film of claim 6 in which the biodegradable adhesive layer is comprised of poly(hydroxy acid).

8. The metalized packaging film of claim 7 in which the poly(hydroxy acid) in the adhesive layer is selected from the group consisting of homopolymers of lactic acid homopolymers of glycolic acid, copolymers of lactic acid with up to 30% by weight of another hydroxy acid, copolymers of glycolic acid with up to 30% by weight of another hydroxy acid, and mixtures thereof.

9. The metalized packaging film of claim 8 in which the poly(hydroxy acid) in the adhesive layer is poly(lactic acid).

10. The metalized packaging film of claim 5 in which the adhesive layer is transparent.

11. The metalized packaging film of claim 10 in which the surface of the biodegradable film, which is coated with metal, has been printed with a message or advertising indicia prior to metalization.

12. The metalized packaging film of claim 5 in which the cellulosic substrate is cardboard or paperboard.

\* \* \* \* \*